United States Patent [19]
Koduri et al.

[10] Patent No.: US 6,292,580 B1
[45] Date of Patent: Sep. 18, 2001

[54] EFFICIENT ILLUMINATION SYSTEM FOR WIRE BONDERS

[75] Inventors: Sreenivasan K. Koduri, Dallas; Joe D. Woodall, Euless; Lance C. Wright, Richardson; Charles K. Harris, Dallas, all of TX (US)

[73] Assignee: Texas Instruments Incorporated, Dallas, TX (US)

[*] Notice: Subject to any disclaimer, the term of this patent is extended or adjusted under 35 U.S.C. 154(b) by 0 days.

[21] Appl. No.: 09/111,977

[22] Filed: Jul. 8, 1998

Related U.S. Application Data

[60] Provisional application No. 60/052,302, filed on Jul. 11, 1997.

[51] Int. Cl.[7] .................................................. G06K 9/00
[52] U.S. Cl. ............................................................ 382/141
[58] Field of Search ..................................... 382/141, 151; 356/394, 237.1, 375, 376, 237; 362/231, 227, 230, 246, 252, 801, 98, 250, 245, 240, 242, 243, 244, 299

[56] References Cited

U.S. PATENT DOCUMENTS

| | | | |
|---|---|---|---|
| 5,153,668 | * 10/1992 | Katzir et al. ...................... 356/237.2 |
| 5,394,246 | * 2/1995 | Sugawara .............................. 356/394 |
| 5,535,006 | * 7/1996 | Telschow et al. .................... 356/394 |
| 5,686,994 | * 11/1997 | Tokura ................................. 356/394 |
| 5,859,924 | * 1/1999 | Liu et al. .............................. 382/145 |

* cited by examiner

Primary Examiner—Joseph Mancuso
Assistant Examiner—Ali Bayat
(74) Attorney, Agent, or Firm—Wade James Brady, III; Frederick J. Telecky, Jr.

[57] ABSTRACT

An illumination system for wire bonding at wire bonding locations which includes a first light source for directing light to the location to be illuminated along a predetermined axis, preferably normal to the wire bonding location, and a second light source having an aperture therethrough extending along the predetermined axis directing light in a pattern from around the aperture to the location to be illuminated. A portion of the light is reflectable back from the location to be illuminated through the aperture. The first light source directs light therefrom through the aperture. The light from the second light source for viewing of the lead frame comes from around the object and is diffused so that it scatters in all directions and at all angles. The amount of scattering depends upon the surface roughness at the edge of the light conductor from which the light exits the light conductor. A beam splitter is disposed between the first light source and the aperture, the light from the first light source passing through the beam splitter. The system also receives and stores a digital representation of the reflected light which is reflected from the beam splitter. The system optionally includes a third light source for directing light to the location to be illuminated. The light sources are individually controllable.

20 Claims, 2 Drawing Sheets

EFFICIENT ILLUMINATION SYSTEM FOR WIRE BONDERS

This application claims priority under 35 USC 119(e)(1) of provisional application No. 60/052,302 filed Jul. 11, 1997.

BACKGROUND OF THE INVENTION

1. Field of the Invention

This invention relates to an illumination system for use in conjunction with wire bonding equipment used in the fabrication of semiconductor devices.

2. Brief Description of the Prior Art

In the fabrication of semiconductor devices, one of the operations generally required involves the bonding of wires between two bonding locations, generally between bond pads on the semiconductor device and lead fingers of a lead frame. This bonding operation requires the use of a wire bonder. A wire bonder uses fine gold wire to couple the bond pads on the semiconductor chip to the individual leads or pins to which connection is to be made, such as, but not limited to, the lead fingers of the lead frame. With the continued diminution in the geometry of semiconductor devices as well as the components within and on the semiconductor devices, it has become increasingly difficult to accurately locate the bond pads and leads or pins to which connection must be made. Bond pads are now approaching dimensions of 5 mils or 25 microns. It is necessary that the bonder know precisely where the connections are to be made on a chip by chip basis since the bond locations can differ from chip to chip, even on essentially identical chips.

To mitigate this problem, a machine-vision system was developed to locate the exact positions where these connections or bonds are to be made. The vision system automatically magnifies, displays, measures and locates different parts of the device at which bonds are to be made. This vision system includes mainly electronics, software, camera, optics and illumination units. Since ambient light is generally insufficient to properly illuminate the chip and lead frame components to which the bond is to be made, illumination units are required to provide the required light to make visible the device to which a bond is to be made while the camera takes pictures through the optics. This picture is digitally stored in the electronics hardware and is digitally processed by the software.

To view different parts of the object, different kinds of lighting are required. In general, an axial light is used to view the die surface because the die surface is generally very smooth and reflects incident light without scattering. Accordingly, incident light directed parallel to an optical axis normal to the surface of the die is reflected back almost entirely parallel to the optical axis. An off axis light is used to view the lead frame which has a generally rough surface and scatters light impinging thereon. The light on the lead frame must be applied evenly to avoid dark spots in the picture, the dark spots (e.g. shadows) introducing features which are not actually a part of the structure being viewed and therefore being undesirable. Accordingly, for viewing of the lead frame, incident light comes from around the object and is diffused so that it scatters in all directions and at all angles. The amount of scattering depends upon the surface roughness of the light conductor which is preferably a highly light transmissive plastic, preferably an acrylic such as Plexiglass or a polycarbonate such as Lexan. The degree of diffusion can vary, depending upon the type of product being bonded. Axial light is also referred to herein as "top light" while off axis light is also referred to herein as "ring light".

In general, in prior art illumination systems for use in conjunction with the bonding operation in semiconductor fabrication, two large moving air-cooled light boxes located at an isolated region on the bonding machine are used to generate the required light. This light is collected using light collecting reflectors and is transferred to the working area using flexible fiber optic cables. At the working area, these fiber optic cables are formed into a standard shape to provide the required type of lighting. This method of generating a large amount of light at an isolated area and transferring it to the required location is highly inefficient and expensive.

SUMMARY OF THE INVENTION

In accordance with the present invention there is provided a patentably novel illumination system to increase the efficiency and decrease the cost of illumination for wire bonders while providing additional features such as software programmability of the illumination system. Multiple units of miniature light sources, preferably incandescent bulbs, light emitting diodes (LEDs) or a combination thereof are used to produce the required light. These miniature light sources are mounted in a specially designed light transmitting mount which is a light conductor which is preferably a highly light transmissive plastic, preferably an acrylic such as Plexiglass or a polycarbonate such as Lexan. The mount collects the light and directs it in a controlled fashion with minimal energy loss.

Briefly, there are provided a top light, a ring light and, optionally, an oblique light. The ring light has a central bore extending therethrough along the ring light axis and is shaped to transmit light emanating within the ring light in a conical, circular or rectangular pattern which surrounds the area to be illuminated. For viewing of the lead frame, the incident light comes from around the object and is diffused so that it scatters in all directions and at all angles. The amount of scattering depends upon the surface roughness at the edge of the light conductor from which the light exits the light conductor. Maximum light is passed through the light conductor by shaping the exterior surface of the ring light to reflect light emanating from the light sources along or toward the ring light axis and at the device being fabricated whereby a sufficient amount of the scattered light is reflected back along the axis of the ring light. This is generally accomplished by having the exterior surface parabola-shaped, though other combinations of geometries and light source positioning can also provide the desired result. The central bore along the optical axis permits the reflected light to travel through the bore to the optics and back to the camera as in the prior art. The ring light is fabricated from a highly light transmissive, preferably moldable medium, such as, for example, acrylics and polycarbonates of the types previously described herein.

A top light is provided to pass a light beam through the bore along the axis of the ring light whereby the light passes through the beam splitter and impinges on the device being fabricated and is then reflected back to the beam splitter and reflected therefrom to the camera in conjunction with optics in the optical path as in the prior art. The top light can have any combination of shape and positioning of the one or more light sources therein to provide a light beam along the ring light axis and through the bore therein. This light is reflected back through the bore in the ring light.

An optional oblique light has a shape and construction similar to the top light and is positioned to provide a light beam to the device being fabricated at some acute or obtuse angle, as required for a special purpose. All of the lights are controllable individually by software associated with the machine vision system.

Incorporation of the design in accordance with the present invention not only eliminates the problems faced with the current system, but also provides added advantages, among these being cost savings, better control over the illumination level, elimination of unreliable moving parts, no cooling requirement, high efficiency in use of generated light, small and light weight, fast response time and longer means time between failures.

DESCRIPTION OF THE PREFERRED EMBODIMENTS

Figure 1:
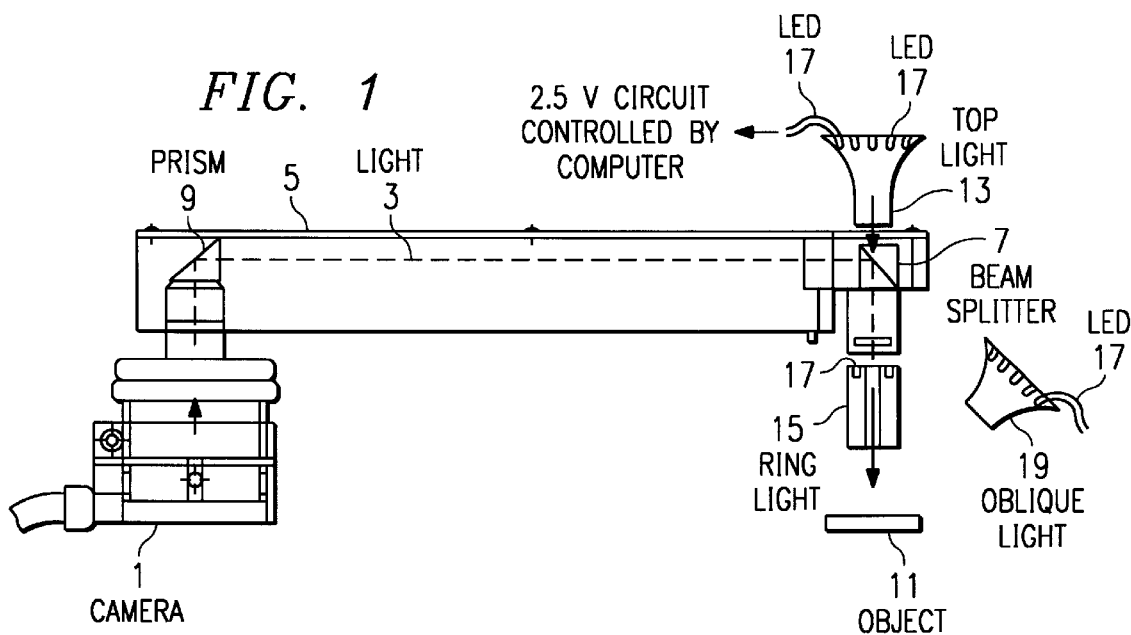
FIG. 1 is a schematic diagram of an optics assembly with camera and illumination source in accordance with the present invention.

Referring first to FIG. 1, there is shown a layout of an optics assembly with camera according to the prior art using the light sources in accordance with the present invention. There is shown a camera 1 which receives a picture of the object or device 11 being fabricated along an optical path 3 within an optical tube 5. The optical tube 5 includes therein a beam splitter 7 for transmitting light therethrough from a top light 13 and reflecting light from the object or device 11 being fabricated to the camera via a prism 9. The top light 13 can be placed anywhere along the length of the optical tube 5 with a beam-splitter. A ring light 15 provides the off axis light and is a highly light transmissive member having a central bore extending therethrough. The essential part of the ring light 15 is the hollow tube with the opening in the middle for the incident light from the top light 13 to pass through and the reflected light from the object or device 11 to pass through on the path to the camera. The miniature light sources 17 are mounted on the top end of the tube and can be controlled by the computer. Light from these sources is collected and channeled by the plexiglass tube to the bottom end where it is diffused to give uniform lighting over the object 11. Oblique lighting is required for some special types of devices on which the incident light is required to be strictly directional and at a larger angle. Because of the small size and low cost, multiple oblique lights can be installed to provide custom illumination for the devices that require them. An optional oblique light 19 provides light at any predetermined angle, if required. The composition and structure of the top light 13, ring light 15 and oblique light 17 are provided hereinbelow.

Figure 2A:
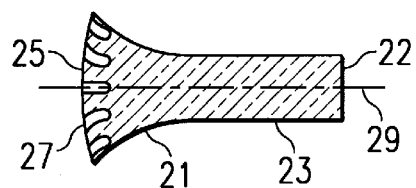
FIGS. 2a and 2b are cross sectional and end views of a first embodiment of a top light in accordance with the present invention.
Figure 2B:
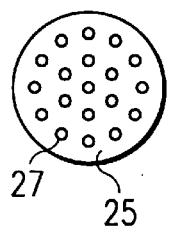
Figure 2C:
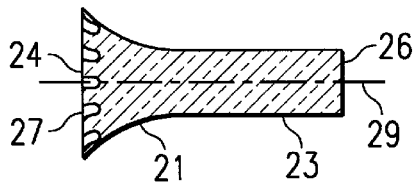
FIGS. 2c and 2d are a cross sectional and top view respectively of a second embodiment of a ring light in accordance with the present invention.
Figure 2D:
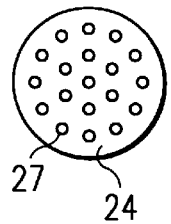
Figure 2E:
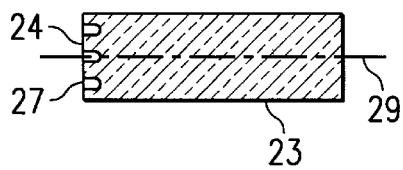
FIGS. 2e and 2f are a cross sectional and top view respectively of a third embodiment of a ring light in accordance with the present invention.
Figure 2F:
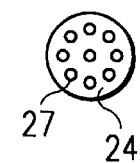

Referring now to FIGS. 2a to 2b, there is shown a first preferred embodiment of a top light which can be used in accordance with the present invention. It should be understood that these embodiments are merely exemplary and that many other arrangements can be used which provide the same result. With reference to FIGS. 2a and 2b, the top light comprises a conically shaped highly light transmissive material 21, preferably a moldable medium, such as, for example, acrylics and polycarbonates of the types previously described herein, with a cylindrical end portion 23 in the form of a light pipe, both of standard light pipe material. The conically shaped portion 21 has a parabolically shaped surface 25 at its wide end. A plurality of miniature lamps 27 are disposed in apertures within the transmissive material at the parabolic surface which direct their light toward the top light axis 29. The geometry is such that all light is directed along the axis 29 of the conically shaped member 21 and out via the cylindrically shaped portion 23. The end of the cylindrically shaped portion 22 is also parabolically shaped to further direct the light along the axis 29. In the second embodiment, as shown in FIGS. 2c and 2d, wherein like character references depict the same or similar structure as previously described, the parabolic surfaces 22 and 25 are replaced by a flat surfaces 24 and 26. In the third embodiment, as shown in FIGS. 2e and 2f, wherein like character references depict the same or similar structure as previously described, the parabolic surfaces 22 and 25 are replaced by a flat surfaces 24 and 26. In each embodiment there can be concentric circles of lamps as well as a centrally located lamp.

Figure 3B:
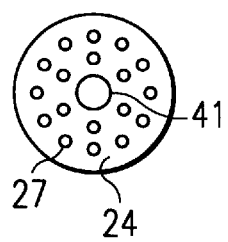
FIGS. 3a and 3b are cross sectional and end views of a first embodiment of a ring light in accordance with the present invention.
Figure 3A:
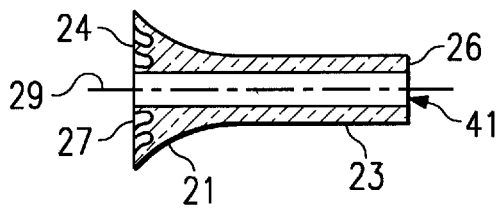
Figure 3D:
FIGS. 3c and 3d are cross sectional and end views of a second embodiment of a ring light in accordance with the present invention.
Figure 3C:
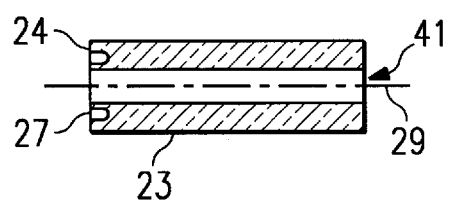
Figure 3F:
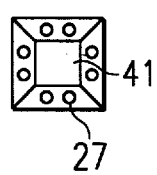
FIGS. 3e and 3f are cross sectional and end views of a third embodiment of a ring light in accordance with the present invention.
Figure 3E:
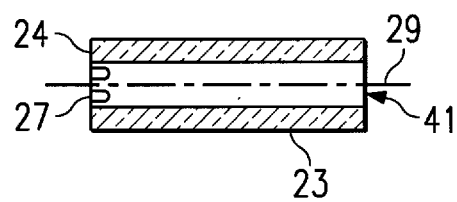

The ring light is designed the same as the top light of FIGS. 2c and 2d except that it contains a central bore therethrough and provides a conically or cylindrically shaped light beam to the device or object. Three typical designs are shown in FIGS. 3a to 3f which are merely exemplary. In FIGS. 3a and 3b the structure is identical to that of FIG. 2b except that the bore 41 is provided to permit light from the top light to pass therethrough and to permit light reflected from the object to also pass therethrough as discussed above. Due to the existence of the bore, the light travels in a circular path. The ring light is circular, so it produces a rough circular pattern. The material is transparent, so the light travels therethrough and scatters at the exit due to the diffuse surface. FIGS. 3c and 3d are the same as FIGS. 3a and 3b except that the entire highly light transmissive material is cylindrically shaped. FIGS. 3e and 3f are the same as FIGS. 3c and 3d except that the cross sectional shape is rectangular rather then circular.

Figure 4B:
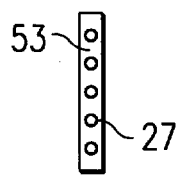
FIGS. 4a and 4b are cross sectional and end views of a first embodiment of an oblique light in accordance with the present invention.
Figure 4A:
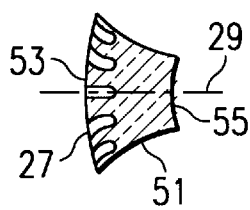
Figure 4D:
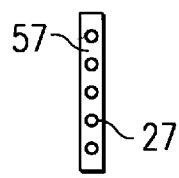
FIGS. 4c and 4d are cross sectional and end views of a second embodiment of an oblique light in accordance with the present invention.
Figure 4C:
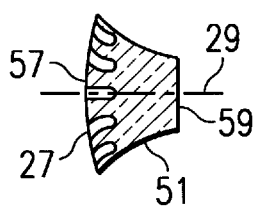

The oblique light is designed to provide light in a single direction, but from an angle off of the axis of the top and ring lights. Two typical embodiments of the oblique light are shown in FIGS. 4a to 4d. Each oblique light is in the shape of a frustum of a triangle 51 with sufficient thickness to retain bulbs 27 therein. In the embodiment of FIGS. 4a and 4b, both the wide end 53 and the narrow end 55 are curved, preferably in the shape of a parabola, whereas in the embodiment of FIGS. 4c and 4d the wide end 57 is curved, preferably in the shape of a parabola, whereas the narrow end 59 is flat.

As an alternative, in each of the above described embodiments having a parabolically shaped end region at the wider end, the light bulbs can be directed to the parabolically shaped end region with the light then reflected therefrom along the axis of the lighting device.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. An illumination system for wire bonding at wire bonding locations which comprises:
   (a) a first light source including at least one light element for directing light to a location to be illuminated along a predetermined axis; and
   (b) a second light source including at least one light element, said second light source having an aperture therethrough extending around said predetermined axis, said aperture directing light in a pattern from around said axis and in a direction normal to said axis to said location to be illuminated, a portion of said light from each of said first light source and said second light source being reflectable back from said location to be illuminated through said aperture, said first light source directing said light therefrom through said aperture.

2. A system as set forth in claim 1 wherein said axis is normal to a said wire bonding location.

3. A system as set forth in claim 2 wherein the light from said second light source encircles said wiring bonding location and is diffused at said wire bonding location so that it scatters at and from said wire bonding location in all directions and at all angles, the amount of scattering depending upon the surface roughness at the edge of said second light source from which the light exits the light source.

4. A system as set forth in claim 3 wherein said first light source includes a light transmissive member having a conically shaped portion extending onto a cylindrical end portion, both coaxial with said axis and at least one lighting element disposed in said light transmissive member for directing light along said axis.

5. A system as set forth in claim 4 wherein said conically shaped portion has a parabolically shaped end portion.

6. A system as set forth in claim 5 further including means to control the operation of each of said light elements of said first, second and third light sources individually.

7. A system as set forth in claim 4 further including means to control the operation of each of said light elements of said first, second and third light sources individually.

8. A system as set forth in claim 3 further including means to control the operation of each of said light elements of said first and second light sources individually.

9. A system as set forth in claim 2 wherein said first light source includes a light transmissive member having a conically shaped portion extending onto a cylindrical end portion, both coaxial with said axis and at least one lighting element disposed in said light transmissive member for directing light along said axis.

10. A system as set forth in claim 9 wherein said conically shaped portion has a parabolically shaped end portion.

11. A system as set forth in claim 2 further including means to control the operation of each of said light elements of said first and second light sources individually.

12. A system as set forth in claim 1 wherein the light from said second light source encircles said wiring bonding location and is diffused at said wire bonding location so that it scatters at and from said wire bonding location in all directions and at all angles, the amount of scattering depending upon the surface roughness at the edge of said second light source from which the light exits the light source.

13. A system as set forth in claim 12 wherein said first light source includes a light transmissive member having a conically shaped portion extending onto a cylindrical end portion, both coaxial with said axis and at least one lighting element disposed in said light transmissive member for directing light along said axis.

14. A system as set forth in claim 13 wherein said conically shaped portion has a parabolically shaped end portion.

15. A system as set forth in claim 12 further including means to control the operation of each of said light elements of said first and second light sources individually.

16. A system as set forth in claim 1 wherein said first light source includes a light transmissive member having a conically shaped portion extending onto a cylindrical end portion, both coaxial with said axis and at least one lighting element disposed in said light transmissive member for directing light along said axis.

17. A system as set forth in claim 16 wherein said conically shaped portion has a parabolically shaped end portion.

18. A system as set forth in claim 17 further including means to control the operation of each of said light elements of said first, second and third light sources individually.

19. A system as set forth in claim 16 further including means to control the operation of each of said light elements of said first, second and third light sources individually.

20. A system as set forth in claim 1 further including means to control the operation of each of said light elements of said first and second light sources individually.

* * * * *